United States Patent [19]

Rohatgi et al.

[11] Patent Number: 5,525,760
[45] Date of Patent: Jun. 11, 1996

[54] FAN-FOLD SHIELDED ELECTRICAL LEADS

[75] Inventors: Rajeev R. Rohatgi, Mountain View; Thomas E. Cowan, Livermore, both of Calif.

[73] Assignee: The United States of America as represented by the United States Department of Energy, Washington, D.C.

[21] Appl. No.: 355,792

[22] Filed: Dec. 14, 1994

Related U.S. Application Data

[62] Division of Ser. No. 39,671, Mar. 30, 1993, Pat. No. 5,375,321.

[51] Int. Cl.$^6$ ..................................... H05K 1/00
[52] U.S. Cl. .................. 174/254; 361/749; 361/813; 439/77; 174/35 R
[58] Field of Search ................ 174/250, 251, 174/254, 258, 35 R; 361/749, 813, 750; 439/67, 77

[56] References Cited

U.S. PATENT DOCUMENTS

| | | | |
|---|---|---|---|
| 3,579,206 | 5/1971 | Grange | 340/173.1 |
| 4,781,601 | 11/1988 | Kuhl et al. | 439/77 |
| 4,792,879 | 12/1988 | Bauknecht et al. | 361/424 |
| 4,886,461 | 12/1989 | Smith | 439/67 |
| 4,902,236 | 2/1990 | Hasircoglu | 439/77 |
| 5,220,488 | 6/1993 | Denes | 361/398 |
| 5,224,023 | 6/1993 | Smith et al. | 361/412 |
| 5,229,916 | 7/1993 | Frankeny et al. | 361/386 |
| 5,265,322 | 11/1993 | Fisher et al. | 29/848 |

*Primary Examiner*—Laura Thomas
*Attorney, Agent, or Firm*—L. E. Carnahan; Henry Sartorio; William R. Moser

[57] ABSTRACT

Fan-folded electrical leads made from copper cladded Kapton, for example, with the copper cladding on one side serving as a ground plane and the copper cladding on the other side being etched to form the leads. The Kapton is fan folded with the leads located at the bottom of the fan-folds. Electrical connections are made by partially opening the folds of the fan and soldering, for example, the connections directly to the ground plane and/or the lead. The fan folded arrangement produces a number of advantages, such as electrically shielding the leads from the environment, is totally non-magnetic, and has a very low thermal conductivity, while being easy to fabricate.

5 Claims, 1 Drawing Sheet

FAN-FOLD SHIELDED ELECTRICAL LEADS

The United States Government has rights in this invention pursuant to Contract No. W-7405-ENG-48 between the United States Department of Energy and the University of California for the operation of Lawrence Livermore National Laboratory.

This is a Division of application Ser. No. 08/039,671 filed Mar. 30, 1993 now U.S. Pat. No. 5,375,321.

BACKGROUND OF THE INVENTION

The invention relates to the fabrication of electrical leads, particularly to shielded electrical leads, and more particularly to fan-fold shielded electrical leads and a method for fabricating same.

Electrical leads are formed on substrates for various applications and numerous configurations, including multi-layer assemblies, have been designed and fabricated. These designs include approaches for shielding the leads from the environment, both physical and electrical as well as providing flexible substrates on which leads are formed. One of the problems associated with the design of electronic components is "cross-talk" among the components, and thus shielding has become a major concern. As the electronic technology develops, in addition to the need of electrical signal leads to be electrically shielded from the environment, including other signal leads, there in a need for such electrical leads to be non-magnetic, have very low thermal conductivity, be vacuum compatible, bakeable, compatible with cryogenic temperatures, designed for multiple signal applications, while being easy to manufacture and thus inexpensive. In addition, such signal leads must in some instances be suitable for high voltage applications. While the prior known designs and fabrication techniques have resulted in satisfactory electrical signal leads for certain of these needs, such are often expensive and/or have certain limitations for use in certain types of applications. Thus, there is a need for electrical signal leads which can satisfy the above-identified requirements, and which can also be fabricated inexpensively. The fan-fold shielded electrical leads of this invention meets all of the above-mentioned needs, and in addition permits easy connections to be made to the signal leads at any point (or multiple points) along the length of the signal leads. In addition, the shielded electrical leads of this invention are suitable for handling voltages in excess of 1000 volts.

SUMMARY OF THE INVENTION

It is an object of the present invention to provide a method of fabricating electrical leads having physical and electrical shielding.

It is a further object of this invention to provide multiple electrical leads which are shielded, non-magnetic, have very low thermal conductivity, are vacuum and cryogenic compatible, and are bakeable.

A further object of the invention is to provide fan-fold shielded electrical leads, which has the capability for uses with voltages in excess of a 1000 volts.

Another object of the invention is to provide a method for fabricating fan-fold shielded electrical signal leads.

Other objects and advantages of the invention will become apparent from the following description and accompanying drawings.

Basically, the invention involves shielded electrical leads and a method of fabricating same, whereby the electrical leads are shielded both physically and electrically, while being vacuum and cryogenic temperature compatible, being totally non-magnetic while being bakeable, having a very low thermal conductivity, and suitable for multiple signal and/or multiple layer applications. In addition, the shielded electrical leads of this invention are suitable for voltages in excess of 1000 volts. More specifically, the above-identified advantages of the present invention result from a fan-fold shielded electrical lead assembly which is easily fabricated and may effectively use any number of electrical leads. The method of fabrication is carried out by simply etching away certain areas of a double cladded substrate to form electrical leads on one side and fan-folding the substrate such that the electrical lead are at the bottom of each fan-fold, thus providing maximum shielding therefore.

The leads can be readily connected by soldering, for example, electrical connections thereto, after partially opening the fan-folds.

BRIEF DESCRIPTION OF THE DRAWINGS

The accompanying drawings, which are incorporated into and form a part of the disclosure, illustrate an embodiment of the invention and, together with the description, serve to explain the principles of the invention.

DETAILED DESCRIPTION OF THE INVENTION

The present invention is divided to fan-folded electrical leads and a method for fabricating same. Basically, the invention is made from a double clad substrate with the cladding on one side of the substrate serving as a ground plane and the cladding on the other side is etched to form the desired leads, whereafter the substrate is fan-folded such that each lead is located at the bottom of a fold so as to provide shielding on both sides of the leads.

Electrical connections are made directly to the leads or to the ground plane by partially opening the fan-folds and soldering or otherwise securing the connections, whereafter the fan-folds may be reclosed if desired. This invention provides one or more electrical leads that are electrically and physically shielded from the environment, totally non-magnetic, has very low thermal conductivity, is vacuum compatible, bakeable, compatible with cryogenic temperatures, and designed suitable for single and multiple signal leads, while additionally being easy to manufacture.

While the following description and accompanying drawings set forth an embodiment of the invention made of double-clad copper with two (2) leads, such is for illustration purposes, since the fan-fold arrangement may utilize a single lead or multiple lead and be made of any suitable conductive double-clad material. By way of example, during experimental verification of this invention, nine (9) fan-folded leads were formed on a single substrate. It is also recognized that the lead bearing substrates can be connected together to form any desired number of leads on a single assembly.

Figure 1:
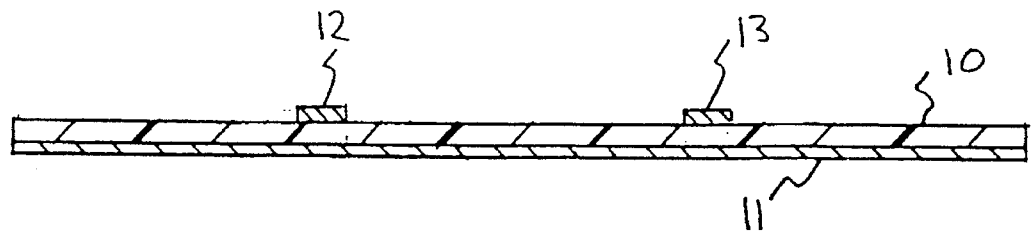
FIGS. 1–3 illustrate in cross-section various fabrication steps for fabricating the fan-fold shielded electrical leads of this invention, with FIG. 3 illustrating in cross-section an embodiment of the completed shielded electrical lead assembly.
Figure 3:
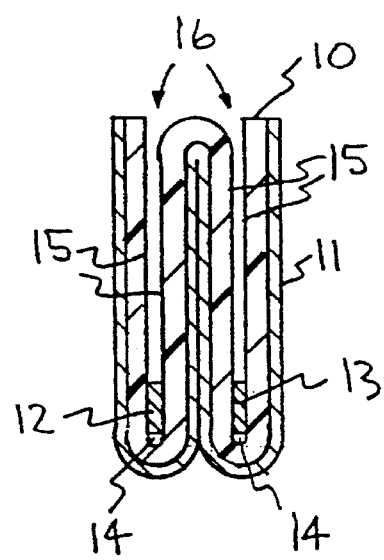

The fan-fold shielded electrical lead assembly illustrated in FIG. 3 is fabricated from copper-clad Kapton. As shown in FIG. 1, the copper on one side of the substrate 10 is retained as a ground plane 11, and the copper on the other side is etched away to form signal leads 12 and 13. The technique for etching the copper is well known, and is exemplified by selectively covering the copper-clad surface with adhesive tape and immersing in a saturated aqueous solution of Ferric Chloride. The uncovered portion of copper cladding is etched away in typically 20 minutes (longer if the solution is not saturated), exposing the inert substrate, and leaving behind the copper cladding in those regions covered, or masked, by adhesive tape. For example, the leads 12 and 13 are 1/16 inch wide, spaced 1/2 inch apart, using 0.005 inch thick Kapton that has been clad with copper on both sides. The thickness of the copper is 1/2 oz/square foot, or 0.0007 inch thick, on both sides of the substrate 10. Kapton is a Trademark for polyimide material, specifically a polypyromellitimede, manufactured by E. I. duPont deNemour and Co., Inc.

Figure 2:
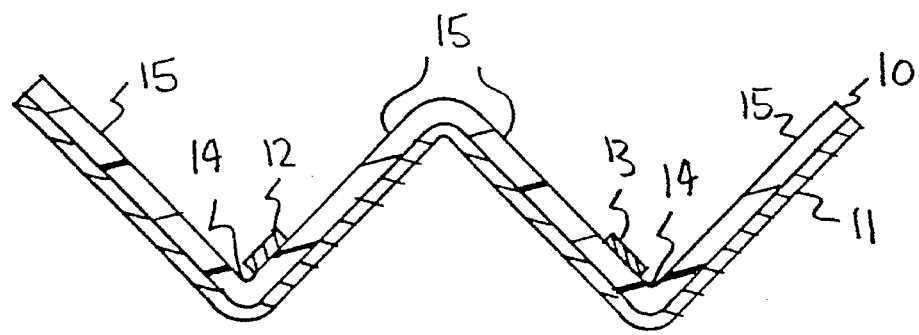

The thus etched Kapton substrate 10 is then folded lengthwise in a fan-fold, as illustrated in FIG. 2, leaving the leads 12 and 13 located at the bottom of grooves or bends 14 formed by sides or surfaces 15 of the substrate 10. Whereafter the sides or surfaces 15 of substrate 10 are pressed flat forming fan-folds 16, as shown in FIG. 3, providing maximum shielding of leads 12 and 13 between the sides or surfaces 15 of the Kapton substrate 10. Maximum shielding is achieved because the leads 12 and 13 are almost totally surrounded by the ground plane 11.

Electrical connected to leads 12 and 13 can be made along the length thereof by partially opening the fan-folds 16 of the assembly of FIG. 3 and soldering or otherwise electrically connecting wires or the like to the leads 12 and 13 and/or to the ground plane 11, as needed. Whereafter the fan-folds 16 may be repressed flat.

As pointed out above, the fan-fold assembly of FIG. 3 may be constructed with a single lead or with multiple leads, and if desired, the assembly of FIG. 3 can be mechanically and electrically connected to another double-clad assembly having leads formed on one side thereof. While double-clad copper has been described, other electrically conductive materials such as gold, silver and aluminum may be double-clad on an appropriate flexible substrate, provided the substrate and cladding can be readily bent to form the fan-folds without damage to either the substrate or the ground plane. In addition to the Kapton (polyimide) substrate, other dielectric materials may be used as the substrate, such as polyester (Mylar), polytetrafluoroethlene (Teflon), polyethylene, cellulose acetate, polystyrene, fiberglass, fiberglass composites, and paper.

While the fan-fold shielded electrical lead assembly constructed of exemplified copper-clad Kapton, as described above, the transmission line impedance of each signal lead was measured to be 10 ohms, and the capacitive coupling of one signal lead to the adjacent signal lead was 0.016 pF/meter, a vast improvement over conventional flat strip-line geometries. The fan-fold assembly is suitable for voltages in excess of 1000 volts. The thermal and other material properties of Kapton and copper are well-documented in the literature, and Kapton is recognized as being non-magnetic, of very low thermal conductivity, is vacuum and cryogenic temperature compatible, and bakeable.

Other electrically conductive and/or dielectric materials can be substituted in applications of less demanding operating conditions, while retaining the benefits of the fan-fold arrangement. Also, a thicker layer of Kapton, or other dielectric, offers higher voltage standoff and lower capacitance to ground, whereas a thinner layer is easier to fold.

It has thus been shown that the present invention provides a shielded electric signal lead assembly which can be readily fabricated and is capable of a wide variety of applications, as well as permitting easy connection to the shielded leads thereof. In addition to being compatible with various environments, the fan-fold shielded electrical lead assembly is suitable for applications using voltages in excess of 1000 volts.

While a specific embodiment and specific materials and parameters have been described and/or illustrated to provide an understanding of the invention, such is not intended to be limiting, as modifications and changes will become apparent to those skilled in the art. It is intended that the scope of this invention be limited only by the scope of the appended claims.

We claim:

1. An electrical lead assembly, comprising:

a substrate;

a layer of electrically conductive material on one side of said substrate;

a plurality of electrically conductive leads on an opposite side of said substrate;

said substrate and said layer of electrically conductive material having a plurality of interconnected fan-folds such that an electrically conductive lead is located adjacent a bottom section of each fan-fold.

2. The electrical lead assembly of claim 1, constructed from doublecladded copper substrate, wherein a portion of one side of the double-cladding is removed to form said at least one electrically conductive lead.

3. The electrical lead assembly of claim 1, wherein said substrate is made from a sheet of material selected from the group consisting of polyimide, polyester, polytetrafluoroethylene, polyethylene, cellulose, acetate, polystyrene, fiberglass, fiberglass composites and paper.

4. The electrical lead assembly of claim 1, wherein said substrate is made of a dielectric material, and said layer and said lead are composed of material selected from the group consisting of copper, gold, silver and aluminum.

5. Fan-folded shielded electrical lead assembly comprising:

a sheet of polypyromellitimede material;

conductive material on one side of said sheet of forming a ground plane;

conductive material on the opposite side of side sheet of material forming a plurality of spaced, longitudinally extending electrical leads;

said sheet of material being folded in a plurality of interconnected fan-like configurations such that each of the longitudinally extending electrical leads is located adjacent a bottom section of an associated folded section of said fan-like configurations;

whereby maximum shielding for each of said longitudinally extending leads is provided.

* * * * *